US012733194B2

(12) United States Patent
Jung et al.

(10) Patent No.: US 12,733,194 B2
(45) Date of Patent: Sep. 8, 2026

(54) NITRIDE-BASED HIGH ELECTRON MOBILITY TRANSISTOR AND MANUFACTURING METHOD THEREOF

(71) Applicant: ELECTRONICS AND TELECOMMUNICATIONS RESEARCH INSTITUTE, Daejeon (KR)

(72) Inventors: Hyun Wook Jung, Daejeon (KR); Seong Il Kim, Daejeon (KR); Hae Cheon Kim, Daejeon (KR); Youn Sub Noh, Daejeon (KR); Ho Kyun Ahn, Daejeon (KR); Sang Heung Lee, Daejeon (KR); Jong Won Lim, Daejeon (KR); Sung Jae Chang, Daejeon (KR); Il Gyu Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 638 days.

(21) Appl. No.: 17/891,832

(22) Filed: Aug. 19, 2022

(65) Prior Publication Data

US 2023/0054026 A1 Feb. 23, 2023

(30) Foreign Application Priority Data

Aug. 23, 2021 (KR) ........................ 10-2021-0110690

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 64/01* (2025.01); *H10D 64/518* (2025.01)

(58) Field of Classification Search
CPC ............. H10D 62/8503; H10D 30/015; H10D 64/513; H10D 30/475; H10D 30/4755; H10D 62/824; H10D 64/01; H10D 64/518
(Continued)

(56) References Cited

U.S. PATENT DOCUMENTS

| | | | |
|---|---|---|---|
| 7,750,370 | B2 | 7/2010 | Smorchkova |
| 7,910,955 | B2 | 3/2011 | Endoh |

(Continued)

FOREIGN PATENT DOCUMENTS

| | | |
|---|---|---|
| JP | 2013-058774 A | 3/2013 |
| KR | 10-2019-0025480 A | 3/2019 |

OTHER PUBLICATIONS

Hui Sun et al., "Performance optimization of lateral AlGaN/GaN HEMTs with cap gate on 150-mm silicon substrate", Solid-State Electronics, 2017, 130, pp. 28-32.

(Continued)

*Primary Examiner* — David Chen

(57) ABSTRACT

Provided are a nitride-based high electron mobility transistor having enhanced frequency characteristics and an improved structural stability and manufacturing method thereof. The nitride-based high electron mobility transistor includes a first semiconductor layer and a second semiconductor layer sequentially formed on a substrate, source drain electrodes formed on the second semiconductor layer, a first insulating film formed on the second semiconductor layer and having an opening, a dielectric formed on the first insulating film to surround the opening of the first insulating film, a second
(Continued)

insulating film formed on an inner sidewall of the dielectric, and a gate electrode formed on the dielectric to fill the opening of the first insulating film and inside the inner sidewall of the dielectric. A width of the inner sidewall at a bottom end of the dielectric is smaller than a width of the inner sidewall at a top end of the dielectric.

12 Claims, 5 Drawing Sheets

(51) Int. Cl.
*H10D 64/01* (2025.01)
*H10D 64/27* (2025.01)

(58) Field of Classification Search
USPC .............. 257/192, 194, 268, 21.403, 21.407, 257/29.246
See application file for complete search history.

(56) References Cited

U.S. PATENT DOCUMENTS 7,932,539 B2 4/2011 Chen
8,049,252 B2 11/2011 Smith
9,281,204 B2 3/2016 Moore
2007/0164321 A1 7/2007 Sheppard et al.
2011/0049526 A1* 3/2011 Chu .................... H10D 30/025 257/E29.089
2012/0142148 A1* 6/2012 Yoon ..................... H10D 84/05 257/E21.403
2012/0261720 A1* 10/2012 Puglisi ................ H10D 30/015 257/E21.403
2013/0146889 A1* 6/2013 Makiyama .......... H10D 30/015 257/E21.403
2017/0062581 A1* 3/2017 You ....................... H10D 62/85
2022/0208992 A1* 6/2022 Chou .................. H10D 30/475

OTHER PUBLICATIONS

Bo Song et al., "Effect of Fringing Capacitances on the RF Performance of GaN HEMTs With T-Gates", IEEE Transactions on Electron Devices, Mar. 2014, vol. 61, No. 3.

* cited by examiner

NITRIDE-BASED HIGH ELECTRON MOBILITY TRANSISTOR AND MANUFACTURING METHOD THEREOF

CROSS-REFERENCE TO RELATED APPLICATION

The present application claims a convention priority based on Korean Patent Application No. 10-2021-0110690 filed on Aug. 23, 2021, with the Korean Intellectual Property Office (KIPO), the entire content of which is incorporated herein by reference.

BACKGROUND

1. Technical Field

The present disclosure relates to a method of manufacturing a nitride-based high electron mobility transistor and, more particularly, to a nitride-based high electron mobility transistor having improved frequency characteristics and a method of manufacturing the nitride-based high electron mobility transistor.

2. Related Art

With the development of wireless communications technology, the demand for the frequency has rapidly increased, and accordingly, a semiconductor device capable of high-speed signal processing of signals in the gigahertz (GHz) band or higher is required in radars, radio access networks and satellite communication systems.

The nitride-based high electron mobility transistor satisfies the specifications required for a wireless communication system due to its high breakdown voltage and electron saturation velocity. In the past few years, with the development of device scaling technology, the frequency characteristics of nitride-based high electron mobility transistors have been improved. However, a short channel effect that occurs as the device is scaled lowers the drain current control ability, thereby lowering frequency characteristics. Therefore, in order to further improve the frequency characteristics, a manufacturing technique other than scaling is required.

FIG. 1 is a cross-sectional view of a conventional nitride-based high electron mobility transistor with a T-type gate electrode. In this prior art, in order to reduce the gate resistance affecting the frequency characteristic, the upper portion of the gate electrode between the source and the drain is formed to have a large area. Also, in order to reduce a parasitic capacitance, the upper portion of the gate electrode is spaced apart from the semiconductor layer.

However, in the prior art, parasitic capacitance (or fringing capacitance) generated between the lower portion of the gate electrode and the semiconductor layer is still a factor that inhibits the frequency characteristic, and due to the unstable structure in which the narrow lower part of the gate electrode supports the wide upper portion of the gate electrode, it is difficult to make the upper area of the gate electrode wider or to separate the upper part of the gate electrode from the semiconductor layer.

SUMMARY

The present disclosure is designed to solve the parasitic capacitance problem of a nitride-based high electron mobility transistor having a T-shaped gate electrode in the prior art. In the present disclosure, provided are a nitride-based high electron mobility transistor showing the enhanced frequency characteristics and the improved structural stability and a method of manufacturing the nitride-based high electron mobility transistor.

According to an aspect of an exemplary embodiment, a nitride-based high electron mobility transistor includes: a substrate; a first semiconductor layer and a second semiconductor layer sequentially formed on the substrate; a source electrode and a drain electrode formed on the second semiconductor layer; a first insulating film formed on the second semiconductor layer and at least partially on the source electrode and the drain electrode and having an opening between the source electrode and the drain electrode; a dielectric formed on the first insulating film to surround the opening of the first insulating film; a second insulating film formed on an inner sidewall of the dielectric; and a gate electrode formed on the dielectric to fill the opening of the first insulating film and inside the inner sidewall of the dielectric. A width of the inner sidewall at a bottom end of the dielectric is smaller than a width of the inner sidewall at a top end of the dielectric.

The dielectric may include: a first dielectric formed on the first insulating film to surround the opening of the first insulating film; and a second dielectric formed on the first dielectric. A width of an inner sidewall of the first dielectric may be smaller than a width of an inner sidewall of the second dielectric.

The second insulating film may be formed on an inner sidewall of the opening of the first insulating film, and inner and outer sidewalls of the first dielectric and the second dielectric.

An upper outer edge of the second insulating film remaining on an outer sidewall of the second dielectric may have a rounded corner caused by the removing the second insulating film.

The nitride-based high electron mobility transistor may further include an insertion layer disposed between the first semiconductor layer and the second semiconductor layer.

The first insulating film may be made into a multilayer film containing silicon nitride ($Si_3N_4$), silicon dioxide ($SiO_2$), aluminum oxide ($Al_2O_3$), hafnium oxide ($HfO_2$), zirconium oxide ($ZrO_2$), titanium oxide ($TiO_2$), or a combination thereof.

The opening may be formed to be closer to the source electrode than the drain electrode.

A width of the inner sidewall of the first dielectric may be equal to or greater than a width of the inner sidewall of the opening.

A height of the second dielectric may be equal to or smaller than a height of the first dielectric.

The first dielectric and the second dielectric may be made of hydrogen silsesquioxane (HSQ).

The second insulating film may be made into a multilayer film containing silicon nitride ($Si_3N_4$), silicon dioxide ($SiO_2$), silicon oxynitride ($SiO_xN_x$), or a combination thereof.

The gate electrode may include at least two steps on its outer surface respectively supported by the second dielectric and the first dielectric.

According to another aspect of an exemplary embodiment, a method of manufacturing a nitride-based high electron mobility transistor includes: preparing a substrate; forming a first semiconductor layer and a second semiconductor layer sequentially on the substrate; forming a source electrode and a drain electrode on the second semiconductor layer; depositing a first insulating film on the second semiconductor layer and at least partially on the source electrode and the drain electrode; forming an opening in the first insulating film between the source electrode and the drain electrode; forming a dielectric on the first insulating film to surround the opening of the first insulating film; depositing a second insulating film on an inner sidewall of the dielectric; and forming a gate electrode on the dielectric to fill the opening of the first insulating film and inside the inner sidewall of the dielectric. The dielectric is formed such that a width of the inner sidewall at a bottom end of the dielectric is smaller than a width of the inner sidewall at a top end of the dielectric.

The forming of the dielectric on the first insulating film may include: forming a first dielectric on the first insulating film to surround the opening of the first insulating film; and forming a second dielectric formed on the first dielectric. The first dielectric and the second dielectric may be formed such that a width of the inner sidewall of the first dielectric is smaller than a width of the inner sidewall of the second dielectric.

The width of the inner sidewall of the first dielectric may be equal to or greater than a width of the inner sidewall of the opening.

A height of the second dielectric may be equal to or smaller than a height of the first dielectric.

Each of first dielectric and the second dielectric may be formed by patterning hydrogen silsesquioxane (HSQ) by an electron beam lithography.

The depositing of the second insulating film on the inner sidewall of the dielectric may include: depositing the second insulating film on the first insulating film, the first dielectric, and the second dielectric; and removing the second insulating film on a upper surface of the second dielectric while leaving the second insulating film on inner and outer sidewalls of the first dielectric and the second dielectric.

The depositing of the second insulating film on the first insulating film, the first dielectric, and the second dielectric may include: depositing the second insulating film on an inner sidewall of the opening of the first insulating film.

The method may further include: forming a third insulating film on the first insulating film, the metal interconnection, the first dielectric, the second dielectric, and the gate electrode; removing the third insulating film on the metal interconnection; and forming a plating layer on the portion of the metal interconnection where the third insulating film is removed.

According to the nitride-based high electron mobility transistor of the present disclosure, the fringing capacitance between the lower portion of the gate electrode and the semiconductor layer may be reduced due to the dielectric disposed around the gate electrode, which enhances the frequency characteristics of the nitride-based high electron mobility transistor. Also, the parasitic capacitance between the upper portion of the gate electrode and the channel region in the semiconductor layer may be reduced by increasing a height of the dielectric.

In addition, the dielectric supporting the upper portion of the gate electrode enhances the structural stability of the gate electrode and may increase the reliability and yield of the transistor device. The enhanced structural stability of the gate electrode allows to increase the area of the upper surface of the gate electrode to reduce the gate resistance and improve the frequency characteristics. The area of the upper surface of the gate electrode may be increased further because of the cross-sectional structure that the width of the lower portion of the T-shaped gate electrode gradually increases toward the top.

BRIEF DESCRIPTION OF THE DRAWINGS

In order that the disclosure may be well understood, there will now be described various forms thereof, given by way of example, reference being made to the accompanying drawings, in which.

Figure 1:
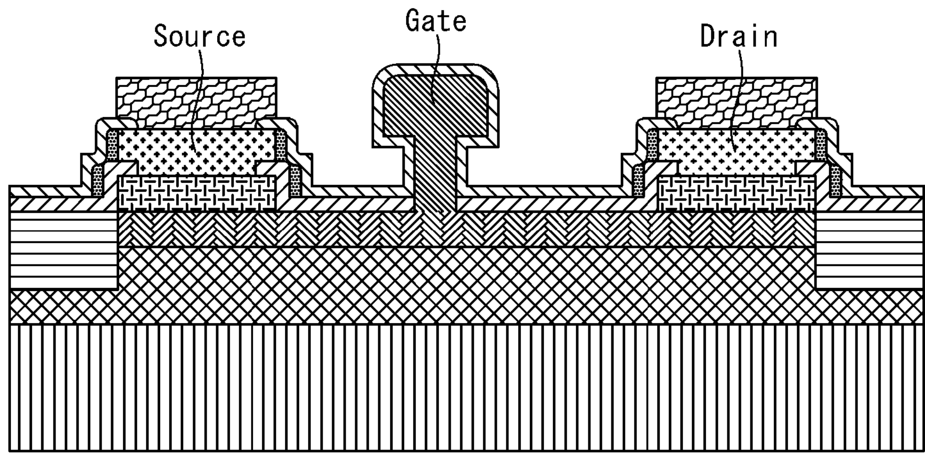
FIG. 1 is a cross-sectional view of a nitride-based high electron mobility transistor of a comparative example.

The drawings described herein are for illustration purposes only and are not intended to limit the scope of the present disclosure in any way.

DETAILED DESCRIPTION

For a clearer understanding of the features and advantages of the present disclosure, exemplary embodiments of the present disclosure will be described in detail with reference to the accompanied drawings. However, it should be understood that the present disclosure is not limited to particular embodiments disclosed herein but includes all modifications, equivalents, and alternatives falling within the spirit and scope of the present disclosure.

The terminologies including ordinals such as “first” and “second” designated for explaining various components in this specification are used to discriminate a component from the other ones but are not intended to be limiting to a specific component. For example, a second component may be referred to as a first component and, similarly, a first component may also be referred to as a second component without departing from the scope of the present disclosure. As used herein, the term “and/or” may include a presence of one or more of the associated listed items and any and all combinations of the listed items.

In the present disclosure, expressions “at least one of A and B” and “at least one of A or B” may mean a group consisting of: “A”, “B”, or “both A and B”. Also, expressions “one or more of A and B” and “one or more of A or B” may mean a group consisting of: “A”, “B”, or “both A and B”.

When a component is referred to as being “connected” or “coupled” to another component, the component may be directly connected or coupled logically or physically to the other component or indirectly through an object therebetween. Contrarily, when a component is referred to as being “directly connected” or “directly coupled” to another component, it is to be understood that there is no intervening object between the components. Other words used to describe the relationship between elements should be interpreted in a similar fashion.

The terminologies are used herein for the purpose of describing particular exemplary embodiments only and are not intended to limit the present disclosure. The singular forms include plural referents as well unless the context clearly dictates otherwise. Also, the expressions “comprises,” “includes,” “constructed,” “configured” are used to refer a presence of a combination of stated features, numbers, processing steps, operations, elements, or components, but are not intended to preclude a presence or addition of another feature, number, processing step, operation, element, or component.

Spatially relative terms such as “below”, “beneath”, “lower”, “above”, “upper”, and so on may be used to easily describe a relative position or direction with respect to a component. The terms, however, should not be regarded to designate an absolute position or direction of related objects. For example, when a component shown in the drawing is turned over, a component described to be placed "below" or "beneath" another component may be placed "above" or "on" the other component. Accordingly, the preposition "below", for example, may include both directions of "below" and "above". Thus, the prepositions of places and direction usage may also be constructed to indicate another positions or directions, and the components in the descriptions of positions and directions may be constructed to be in the other positions and directions or orientations.

Unless defined otherwise, all terms used herein, including technical or scientific terms, have the same meaning as commonly understood by those of ordinary skill in the art to which the present disclosure pertains. Terms such as those defined in a commonly used dictionary should be interpreted as having meanings consistent with their meanings in the context of related literatures and will not be interpreted as having ideal or excessively formal meanings unless explicitly defined in the present application.

Exemplary embodiments of the present disclosure will now be described in detail with reference to the accompanying drawings. In the following description and the accompanied drawings, detailed descriptions of well-known functions or configuration that may obscure the subject matter of the present disclosure will be omitted for simplicity. Also, it is to be noted that the same components are designated by the same reference numerals throughout the drawings.

FIGS. 2 to 9 are cross-sectional views sequentially illustrating a process of manufacturing a nitride-based high electron mobility transistor according to an exemplary embodiment of the present disclosure.

Figure 2:
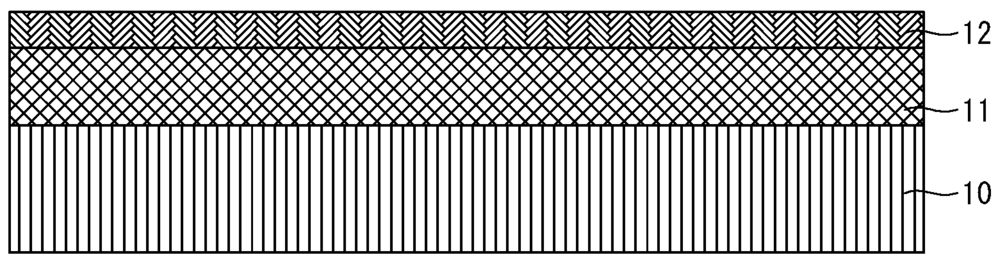
FIGS. 2 to 9 are cross-sectional views sequentially illustrating a process of manufacturing a nitride-based high electron mobility transistor according to an exemplary embodiment of the present disclosure.

Referring to FIG. 2, a substrate 10 may be formed of silicon carbide (SiC), gallium nitride (GaN), diamond, or the like. However, the material for the substrate 10 is not limited thereto.

A first semiconductor layer 11 may be formed on the substrate 10 by a molecular beam epitaxy (MBE) or a metal organic chemical vapor deposition (MOCVD). The first semiconductor layer 11 may be a layer forming a channel. The first semiconductor layer 11 may be made of a III-V compound semiconductor material.

For example, the first semiconductor layer 11 may include aluminum nitride (AlN), indium nitride (InN), gallium nitride (GaN), aluminum gallium nitride (AlGaN), indium gallium nitride (InGaN), indium aluminum nitride (InAlN), indium aluminum gallium nitride (InAlGaN), or the like. However, the material for first semiconductor layer 11 is not limited thereto, and another material may be used for the first semiconductor layer 11 as long as a two-dimensional electron gas (2DEG) may be formed therein. The first semiconductor layer 11 may be an undoped layer, but in some cases may be doped with a certain impurity.

The second semiconductor layer 12 is provided on the first semiconductor layer 11 and forms a heterojunction with the first semiconductor layer 11. The second semiconductor layer 12 may include a semiconductor material having a wider band gap than that of the first semiconductor layer 11 and having a lattice constant different from that of the first semiconductor layer 11. The second semiconductor layer 12 may have a single-layer or multiple-layer structure including at least one material selected from nitrides containing aluminum (Al), gallium (Ga), indium (In), or boron (B).

For example, the second semiconductor layer 12 may have the single-layer or multiple-layer structure including at least one selected from various materials including aluminum gallium nitride (AlGaN), aluminum nitride (AlN), indium aluminum nitride (InAlN), indium gallium nitride (InGaN), indium aluminum gallium nitride (InAlGaN), and the like. The second semiconductor layer 12 may be an undoped layer, but in some cases may be doped with a certain predetermined impurity.

Polarization may be generated by a heterojunction structure between the first semiconductor layer 11 and the second semiconductor layer 12 to induce the two-dimensional electron gas (2DEG) region at the interface of the first semiconductor layer 11. The 2DEG may be used as a channel in a high electron mobility transistor (HEMT).

Although not shown in FIG. 2, a transition layer may be provided between the substrate 10 and the first semiconductor layer 11. The transition layer may alleviate differences in the lattice constant and thermal expansion coefficients between the substrate 10 and the first semiconductor layer 11.

In addition, although not shown in FIG. 2, an insertion layer having a thickness of several nanometers may be formed between the first semiconductor layer 11 and the second semiconductor layer 12. The insertion layer may be made of aluminum nitride (AlN) and may enhance the characteristics of the interface between the first semiconductor layer 11 and the second semiconductor layer 12 and improve the mobility of the 2DEG.

Figure 3:
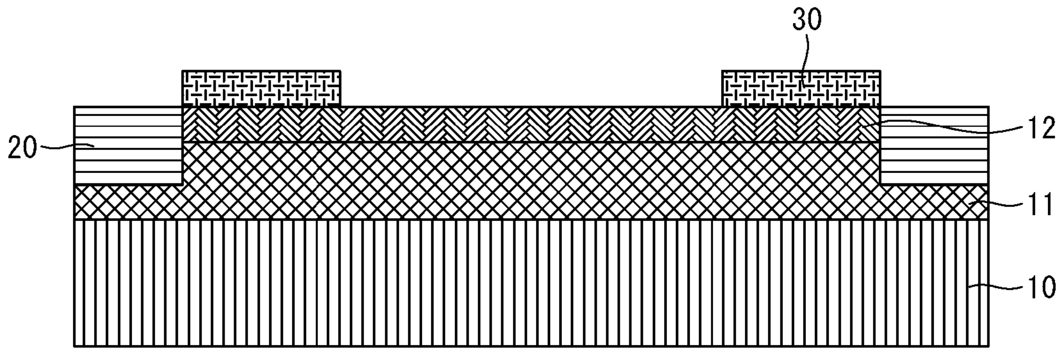

Next, referring to FIG. 3, source and drain electrodes 30 spaced apart from each other are formed on the second semiconductor layer 12. The source and drain electrodes 30 may be formed by patterning a photoresist (PR) by a photolithography, depositing titanium (Ti), aluminum (Al), nickel (Ni), or gold (Au) using an electron beam evaporator. And then, the source and drain electrodes 30 may be finally formed by lifting off the photoresist and annealing them. A distance between the source electrode and the drain electrode may be in a range between 1 and 5 micrometers (μm).

The interfaces between the source and drain electrodes 30 and the second semiconductor layer 12 may include ohmic contacts due to the rapid annealing. That is, the source and drain electrodes 30 may contact the 2DEG serving as the channel layer during the rapid annealing to form non-rectifying electrical junctions.

After the source and drain electrodes 30 are formed, isolation regions 20 may be formed by an ion implantation or etching to electrically isolate the device from adjacent devices.

Figure 4:
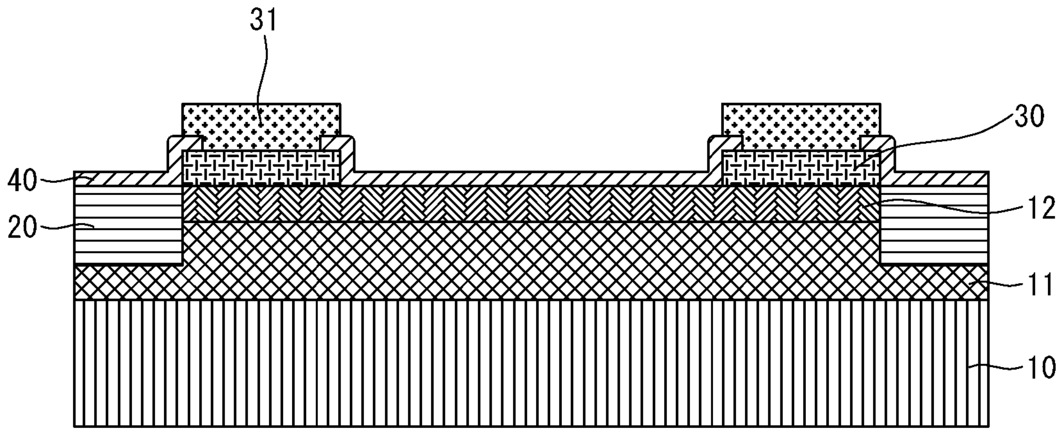

Next, as shown in FIG. 4, a first insulating film 40 is formed on the second semiconductor layer 12 and the source and drain electrodes 30. The first insulating film 40 may be formed by a plasma-enhanced chemical vapor deposition (PECVD) or atomic layer deposition (ALD) and made into a multilayer film including silicon nitride ($Si_3N_4$), silicon dioxide ($SiO_2$), aluminum oxide ($Al_2O_3$), hafnium oxide ($HfO_2$), zirconium oxide ($ZrO_2$), titanium oxide ($TiO_2$), or a combination of such materials. The first insulating film 40 may be a passivation layer preventing the trapping of charges on the surface of the second semiconductor layer 12 to suppress a current decrease and a current collapse.

Subsequently, a photoresist is applied on the first insulating film 40, and the photoresist on some portion of the first insulating film 40 over the source and drain electrodes 30 is patterned by the photolithography and etched by a dry or wet etching. The dry etching may be performed by an inductively coupled plasma (ICP) etching apparatus using carbon tetrafluoride ($CF_4$) gas. Meanwhile, the wet etching may be performed using a buffered oxide etchant (BOE). A width of the etched portion of the first insulating film 40 may be smaller than widths of the source and drain electrodes 30.

A metal interconnection 31 directly contacting the source and drain electrodes 30 may be formed on the region where the first insulating film 40 has been etched. The metal interconnection 31 may be formed to be narrower than widths of the source and drain electrodes 30 but wider than an etched region of the first insulating film 40. The metal interconnection may be referred to as a wiring.

The metal interconnection 31 may be formed by patterning a photoresist by the photolithography, depositing a multiple-layered metal that includes at least one of titanium (Ti) and gold (Au) using an electron beam evaporator, and lifting off the photoresist and redundant metal. Although not shown in FIG. 4, the metal interconnection 31 may be connected to a contact pad provided for an electrical connection between the device and the outside.

Figure 5:
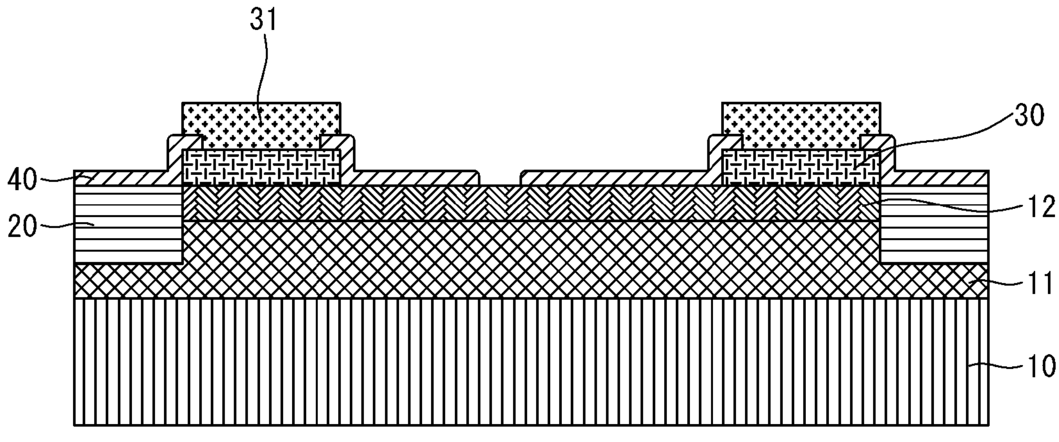

Next, referring to FIG. 5, an opening is formed in the first insulating film 40. The opening may be formed by patterning a photoresist by the photolithography or an electron beam lithography and performing the ICP etching using the carbon tetrafluoride ($CF_4$) gas. The photoresist is used as an etching mask and the remaining photoresist may be stripped off after the etching.

The opening is formed between the source and drain electrodes 30 and may be located closer to the source electrode than the drain electrode to increase a breakdown voltage. The width of the opening, which may vary depending on an operating frequency band of the device, may preferably be in a range of 50-500 nanometers (nm). The opening may be used to form a gate electrode later.

Figure 6:
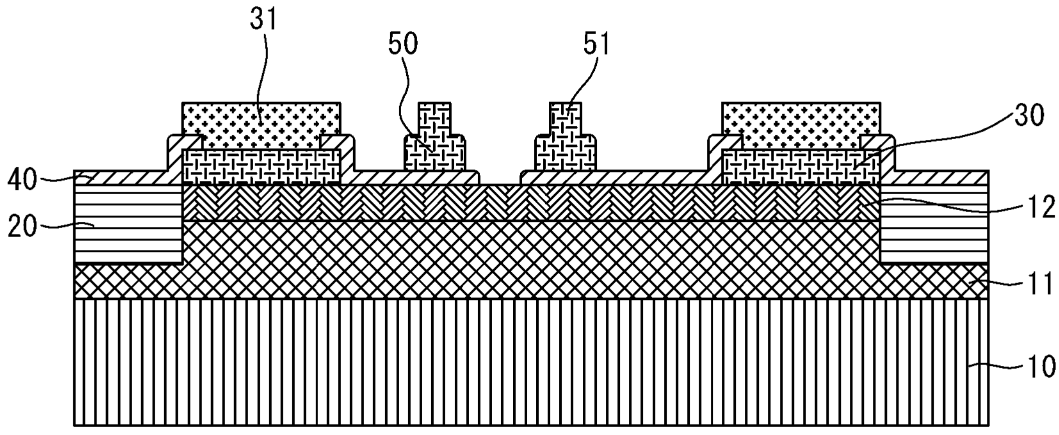

Next, referring to FIG. 6, a first dielectric 50 may be formed on the first insulating film 40 to surround the opening of the first insulating film 40. A distance between opposing inner sidewalls of the first dielectric 50 spaced apart from each other with the opening therebetween may be equal to or greater than the width of the opening.

The first dielectric 50 may be formed by patterning hydrogen silsesquioxane (HSQ), which is a negative electron beam photoresist, by the electron beam lithography. Silicon dioxide ($SiO_2$) may be used for the first dielectric 50 as well, but additional process steps may be required unlike the HSQ in such a case.

Subsequently, a second dielectric 51 may be formed on the first dielectric 50. The second dielectric 51 may be formed by the same process as the first dielectric 50 using the same material as the first dielectric 50. The second dielectric 51 may be made to be equal to or smaller than the first dielectric 50 in its height and the second dielectric 51 may be made to be smaller than the first dielectric 50 in its horizontal dimension. Although not shown in the drawing, an additional dielectric may further be formed on the second dielectric 51.

Figure 7:
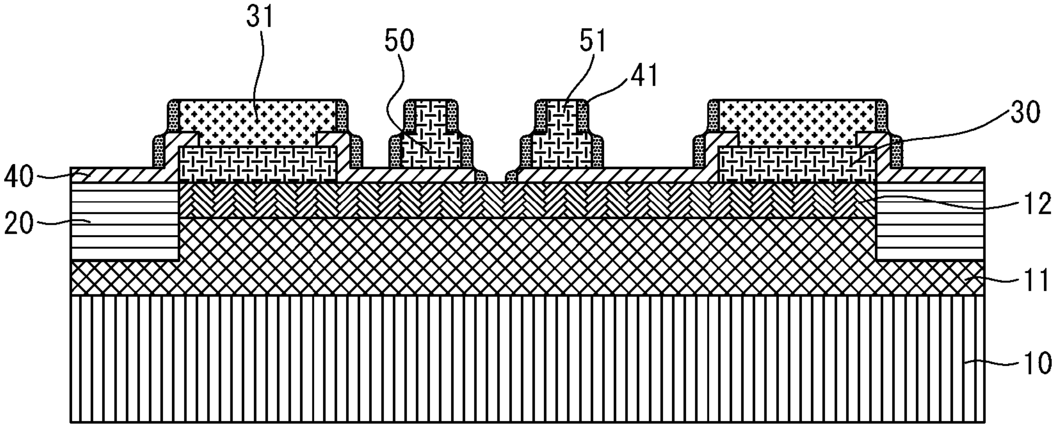

Next, referring to FIG. 7, a second insulating film 41 may be formed on a structure shown in FIG. 6. The second insulating film 41 may be formed by the PECVD or the ALD and made into a multilayer film containing silicon nitride ($Si_3N_4$), silicon dioxide ($SiO_2$), silicon oxynitride ($SiO_xN_x$), or a combination of such materials.

Then, an upper portion of the second insulating film 41 deposited on the second dielectric 51 may be etched away using the ICP etching apparatus, so that the second insulating film 41 may remain on outer sidewalls of the first and second dielectrics 50 and 51. An upper outer edge of the second insulating film 41 remaining on the outer sidewall of the second dielectric 51 may have a rounded corner caused by the etching. The second insulating film 41 present on inner walls of the opening of the first insulating film 40 may result in a decrease in a length of the gate.

Figure 8:
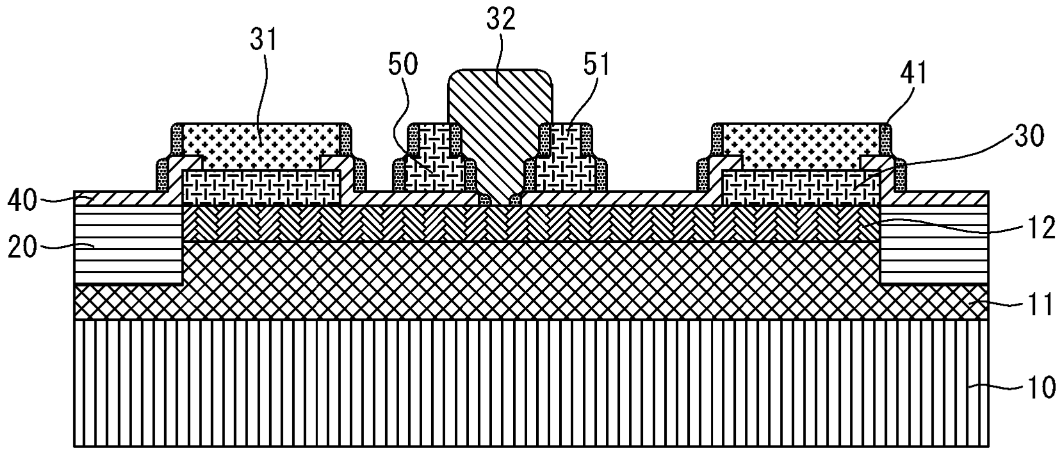

Next, referring to FIG. 8, a T-shaped gate electrode 32 may be formed inside inner sidewalls of the first and second dielectrics 50 and 51 and in the opening. The gate electrode 32 may be formed by patterning a photoresist by the photolithography or the electron beam lithography and depositing nickel (Ni) and gold (Au) or platinum (Pt) and gold (Au) using the electron beam evaporator.

The first and second dielectrics 50 and 51 disposed around a lower portion of the gate electrode 32 may reduce a fringing capacitance between the lower portion of the gate electrode 32 and the channel region. In addition, a parasitic capacitance between an upper portion of the gate electrode 32 and the channel region may be reduced by increasing a height of the first dielectric 50 or the second dielectric 51.

According an exemplary embodiment, it is possible to increase an area of an upper surface of the gate electrode 32 because the width of the lower portion of the T-shaped gate electrode 32 gradually decreases toward its bottom unlike a conventional T-shaped gate. Further, the first and second dielectrics 50 and 51 which supports the upper portion of the gate electrode 32 may enable to increase a thickness of the gate electrode 32 to increase a gate resistance. The height or thickness of the gate electrode 32 may be around 500 nm or larger.

Figure 9:
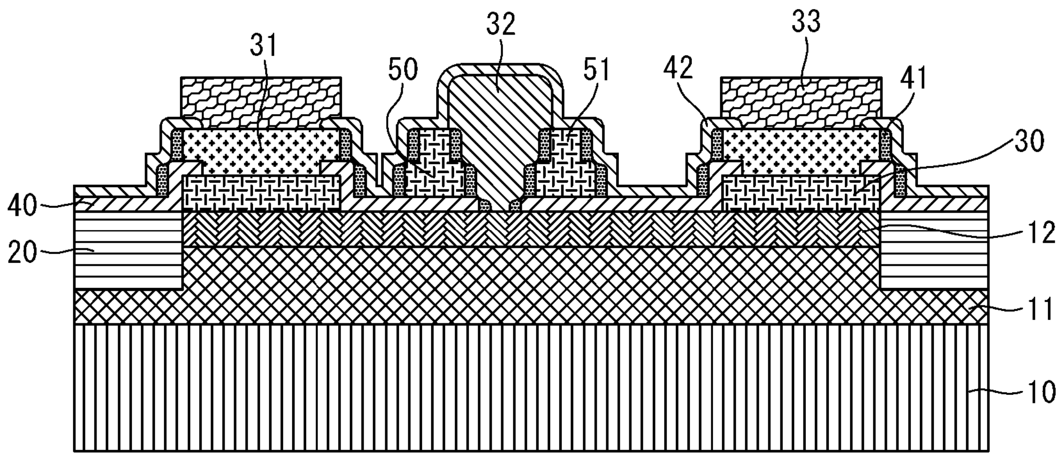

Next, referring to FIG. 9, a third insulating film 43 may be formed on a structure formed by completing the above-described process steps as shown in FIG. 8. The third insulating film 42 may be formed by the PECVD or the ALD and made into a multilayer film containing silicon nitride ($Si_3N_4$), silicon dioxide ($SiO_2$), silicon oxynitride ($SiO_xN_x$), or a combination of such materials.

The third insulating film 42 may serve as a passivation layer. Also, the third insulating film 42 may serve as an insulating film of a metal-insulator-metal capacitor which is a passive device on an integrated circuit. A portion of the third insulating film 42 existing on the metal interconnection 31 may be removed by patterning the photoresist by the photolithography and etching the portion of the third insulating film 42 by the ICP etching apparatus using tetrafluoride ($CF_4$) gas. A width of an etched portion of the third insulating film 32 may be smaller the width of the metal interconnection 31.

Subsequently, a plating layer 33 is formed on the metal interconnection 31 from which the third insulating film 42 has been removed. To form the plating layer 33, a photoresist is applied first on the third insulating film 42 and the metal interconnection 31, and the photoresist existing on some portion of the metal interconnection 31 where the third insulating film 42 has been removed is patterned by the photolithography. Then a base metal is deposited on the metal interconnection 31 exposed through the photoresist pattern.

Afterwards, a photoresist is coated on the base metal and the photoresist existing over the metal interconnection 31 is patterned by the photolithography. Then, a metal is electroplated, and the photoresist and redundant metal are lifted off to complete the plating layer 33. Gold (Au) may be used as a material for the plating layer 33. The thickness of the plating layer 33 may be 3 μm or larger. The width of the plating layer 33 may be smaller than the width of the metal interconnection 31 but may be larger than the width of the etched region of the third insulating film 42.

According to the nitride-based high electron mobility transistor in accordance with the exemplary embodiment of the present disclosure described above, the fringing capacitance between the lower portion of the gate electrode and the semiconductor layer may be reduced due to the dielectric disposed around the gate electrode, which enhances the frequency characteristics of the nitride-based high electron mobility transistor.

Also, according to the present disclosure described above, the parasitic capacitance between the upper portion of the gate electrode and the channel region in the semiconductor layer may be reduced by increasing a height of the dielectric. In addition, the dielectric supporting the upper portion of the gate electrode may enhance the structural stability of the gate electrode and increase the reliability and yield of the transistor device.

Furthermore, according to the present disclosure described above, the enhanced structural stability of the gate electrode allows to increase the area of the upper surface of the gate electrode to reduce the gate resistance and improve the frequency characteristics. In addition, the area of the upper surface of the gate electrode may be increased further because of the cross-sectional structure that the width of the lower portion of the T-shaped gate electrode gradually increases toward the top.

The description of the disclosure is merely exemplary in nature and, thus, variations that do not depart from the substance of the disclosure are intended to be within the scope of the disclosure. Such variations are not to be regarded as a departure from the spirit and scope of the disclosure. Thus, it will be understood by those of ordinary skill in the art that various changes in form and details may be made without departing from the spirit and scope as defined by the following claims.

What is claimed is:

1. A nitride-based high electron mobility transistor comprising:

a substrate;

a first semiconductor layer and a second semiconductor layer sequentially formed on the substrate;

a source electrode and a drain electrode formed on the second semiconductor layer;

a first insulating film formed on the second semiconductor layer and at least partially on the source electrode and the drain electrode and having an opening between the source electrode and the drain electrode, the opening exposing an upper surface of the second semiconductor layer;

a dielectric formed on the first insulating film to surround the opening of the first insulating film, the dielectric having an inner sidewall and an outer sidewall;

a second insulating film formed on the inner sidewall and the outer sidewall of the dielectric; and a gate electrode formed on the dielectric to fill the opening of the first insulating film and inside the inner sidewall of the dielectric so that the gate electrode is in contact with the upper surface of the second semiconductor layer, wherein a width of the inner sidewall at a bottom end of the dielectric is smaller than a width of the inner sidewall at a top end of the dielectric, and wherein the second insulating film is formed along the inner and outer sidewalls of the dielectric and directly contacts the inner and outer sidewalls of the dielectric.

2. The nitride-based high electron mobility transistor of claim 1, wherein the dielectric comprises:

a first dielectric formed on the first insulating film to surround the opening of the first insulating film; and a second dielectric formed on the first dielectric, wherein a width of an inner sidewall of the first dielectric is smaller than a width of an inner sidewall of the second dielectric.

3. The nitride-based high electron mobility transistor of claim 2, wherein the second insulating film is formed on an inner sidewall of the opening of the first insulating film, and outer and the inner sidewalls of the first dielectric and the second dielectric.

4. The nitride-based high electron mobility transistor of claim 2, further comprising:

an insertion layer disposed between the first semiconductor layer and the second semiconductor layer.

5. The nitride-based high electron mobility transistor of claim 1, wherein the first insulating film is made into a multilayer film containing silicon nitride ($Si_3N_4$), silicon dioxide ($SiO_2$), aluminum oxide ($Al_2O_3$), hafnium oxide ($HfO_2$), zirconium oxide ($ZrO_2$), titanium oxide ($TiO_2$), or a combination thereof.

6. The nitride-based high electron mobility transistor of claim 2, wherein the opening is formed to be closer to the source electrode than the drain electrode.

7. The nitride-based high electron mobility transistor of claim 3, wherein the width of the inner sidewall of the first dielectric is equal to or greater than a width of the inner sidewall of the opening.

8. The nitride-based high electron mobility transistor of claim 2, wherein a height of the second dielectric is equal to or smaller than a height of the first dielectric.

9. The nitride-based high electron mobility transistor of claim 2, wherein the first dielectric and the second dielectric are made of hydrogen silsesquioxane (HSQ).

10. The nitride-based high electron mobility transistor of claim 1, wherein the second insulating film is made into a multilayer film containing silicon nitride ($Si_3N_4$), silicon dioxide ($SiO_2$), silicon oxynitride ($SiO_xN_x$), or a combination thereof.

11. The nitride-based high electron mobility transistor of claim 2, wherein the gate electrode comprises at least two steps on its outer surface respectively supported by the second dielectric and the first dielectric.

12. A nitride-based high electron mobility transistor comprising:

a substrate;

a first semiconductor layer and a second semiconductor layer sequentially formed on the substrate;

a source electrode and a drain electrode formed on the second semiconductor layer;

a first insulating film formed on the second semiconductor layer and at least partially on the source electrode and the drain electrode and having an opening between the source electrode and the drain electrode, the opening exposing an upper surface of the second semiconductor layer;

a dielectric formed on the first insulating film to surround the opening of the first insulating film;

a second insulating film formed on an inner sidewall of the dielectric; and a gate electrode formed on the dielectric to fill the opening of the first insulating film and inside the inner sidewall of the dielectric so that the gate electrode is in contact with the upper surface of the second semiconductor layer, wherein a width of the inner sidewall at a bottom end of the dielectric is smaller than a width of the inner sidewall at a top end of the dielectric, wherein the dielectric comprises:

a first dielectric formed on the first insulating film to surround the opening of the first insulating film; and a second dielectric formed on the first dielectric, wherein a width of an inner sidewall of the first dielectric is smaller than a width of an inner sidewall of the second dielectric, wherein the second insulating film is formed on an inner sidewall of the opening of the first insulating film, and outer sidewalls and the inner sidewalls of the first dielectric and the second dielectric, and wherein an upper outer edge of the second insulating film remaining on the outer sidewall of the second dielectric has a rounded corner caused by removing the second insulating film.

* * * * *